United States Patent [19]

Ishizuka et al.

[11] Patent Number: 4,775,085
[45] Date of Patent: Oct. 4, 1988

[54] SEMICONDUCTOR WAFER BREAKING APPARATUS

[75] Inventors: Masahiro Ishizuka; Toshio Komemura; Ichiro Hayashi, all of Itami, Japan

[73] Assignee: Mitsubishi Denki Kabushiki Kaisha, Tokyo, Japan

[21] Appl. No.: 914,865

[22] Filed: Oct. 2, 1986

[30] Foreign Application Priority Data

Oct. 4, 1985 [JP] Japan .................. 60-222104

[51] Int. Cl.⁴ .................................................. B26F 3/00
[52] U.S. Cl. ...................................... 225/105; 225/93; 225/103
[58] Field of Search ............... 225/103, 93, 96.5, 97, 225/1, 4, 5, 2, 104, 105; 125/23 R, 13 R

[56] References Cited

U.S. PATENT DOCUMENTS

| | | | |
|---|---|---|---|
| 3,206,088 | 9/1965 | Meyer et al. | 225/103 |
| 3,497,948 | 3/1970 | Wiesler et al. | 225/5 |
| 3,562,803 | 2/1971 | Townsend | 225/104 |
| 4,005,808 | 2/1977 | Insolio | 225/2 |
| 4,195,758 | 4/1980 | Morgan | 225/4 |

FOREIGN PATENT DOCUMENTS 90478 11/1973 Japan .
73871 6/1976 Japan .

*Primary Examiner*—E. R. Kazenske
*Assistant Examiner*—Hien H. Phan
*Attorney, Agent, or Firm*—Lowe, Price, LeBlanc, Becker & Shur

[57] ABSTRACT

A semi-full cut semiconductor wafer is put on an adhesive sheet attached to a ring frame. Then, the semiconductor wafer is pushed upward from the back surface of the adhesive sheet by a rotatable breaking member in the shape of a disk the edge portion of which is triangular in section. In this state, the ring frame is moved so that the breaking member may not deviate from dicing lines, whereby the semiconductor wafer is divided into a large number of chips.

4 Claims, 6 Drawing Sheets

FIG.8
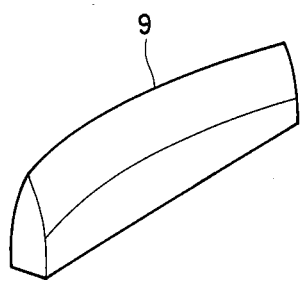
FIG.9
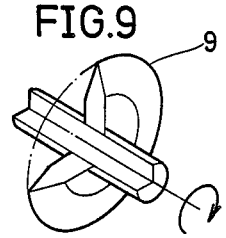
FIG.10    FIG.11
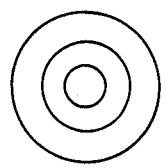    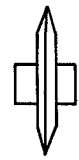

SEMICONDUCTOR WAFER BREAKING APPARATUS

BACKGROUND OF THE INVENTION

1. Field of the Invention

This invention relates to a semiconductor wafer breaking apparatus for dividing a semiconductor wafer into a large number of chips and particularly it relates to an apparatus for dividing into a large number of chips a semi-full cut wafer put on an adhesive sheet.

2. Description of the Prior Art

As is well known, the operation of making cuts in a semiconductor wafer, with portions of a very small thickness being left uncut, along the dicing lines for separating a large number of devices formed on the upper surface of the semiconductor wafer to provide single devices is generally called semi-full cutting operation. This operation has been popularly done in manufacturing of semiconductor devices. In the following, this operation will be referred to simply as semi-full cutting operation.

FIGS. 1 to 3 are views for explaining the semi-full cutting operation of a wafer. Particularly, FIG. 1 is a perspective view showing a state in which a wafer is set; FIG. 2 is a sectional view of the wafer, the adhesive sheet and the frame in FIG. 1, taken along the line A—A; and FIG. 3 is an enlarged view of the region B shown in FIG. 2.

Referring to FIGS. 1 to 3, the semi-full cutting operation of the wafer will be described in the following.

First, the wafer 3 is put on the adhesive surface of an adhesive sheet 2 uniformly provided on a ring-shaped frame (referred to hereinafter simply as the frame 1) as shown in FIG. 1. Then, the frame 1 is positioned appropriately and the above described semi-full cutting operation is performed by using a cutter generally called a dicer. The wafer thus semi-full cut is shown in FIG. 3. As shown in FIG. 3, notches 31 are formed in the wafer 3 at predetermined intervals.

The semi-full cut wafer 3 is divided into chips so as to undergo a subsequent process called die bonding. In the die bonding, the chips are picked up one by one so that they are bonded.

FIG. 4 is a perspective view of a conventional semiconductor wafer breaking apparatus. Now referring to FIGS. 1 to 4, conventional wafer dividing operation using the apparatus in FIG. 4 will be described sequentially in detail.

Referring to FIG. 4, notches 31 as shown in FIGS. 2 and 3 are generally provided in the wafer put on the adhesive surface of the adhesive sheet 2 uniformly attached to the frame 1. The amount left uncut is generally about 20 to 30 μm. Subsequently, as shown in FIG. 4, the semi-full cut wafer 3 is positioned by using a table 5 which comprises a frame positioning and fixing mechanism 4 and is movable along two axes perpendicular to each other. Then, the semi-full cut wafer 3 together with the adhesive sheet 2 is pushed upward by a prescribed amount using a breaking mechanism 8 under the lower surface of the adhesive sheet 2, located in the lower portion of the frame positioning and fixing mechanism 4. The breaking mechanism 8 comprises a break pin 6 having a hemispheric edge portion with a radius of R, and a vertical movement mechanism 7 for raising and lowering the break pin 6. Then, the semiconductor wafer 3 thus pushed upward by the breaking mechanism 8 from the back surface of the adhesive sheet 2 is moved on the breaking mechanism 8 by the table 5 along the dicing lines read in advance by identifying means (not shown). As a result, the wafer 3 is divided into chips.

Such wafer dividing operation will be described in more detail referring to FIGS. 5 to 7.

FIGS. 5 and 6 are sectional views of the semiconductor wafer breaking apparatus shown in FIG. 4 taken along the line D—D. These figures illustrate a breaking operation of the break pin 6 wih respect to the semi-full cut wafer 3 positioned together with the frame 1 by the positioning and fixing mechanism 4.

The break pin 6 located under the back surface of the adhesive sheet 2 as shown in FIG. 5 is raised by the vertical movement mechanism 7 by a prescribed amount as shown in FIG. 6. Subsequently, the semi-full cut wafer 3 is moved by the above stated table 5 along the dicing lines with the wafer 3 being pushed upward by the break pin 6 from the back surface of the adhesive sheet 2.

Then, in the state in which the adhesive sheet 2 is pushed upward by the break pin 6, as shown in FIG. 7 illustrating an enlarged view of the portion E in FIG. 6, a portion 3' not divided out of the wafer 3 is supported by a supporting point O which is a contact point between the break pin 6 and the adhesive sheet 2. Tension T is applied to an end G of the portion 3'. Though not shown, tension is also applied to the whole area of the portion 3'. In other words, bending stress and tensile stress are generally produced in the non-divided portion 3' of the wafer 3. The stresses are particularly concentrated on the portion F left uncut and accordingly if stronger force than the strength of the material of this portion F is applied to this portion F, the wafer 3 is broken at this portion F.

From the foregoing description, in order to facilitate the division of the wafer, some approaches may be considered. For example, decrease of the strength of the material of the remaining portion F, or decrease of the distance L2 from the supporting point O to the remaining portion F to concentrate stress, or increase of the breaiing force may be considered as those approaches.

In order to decrease the strength of the material of the remaining portion F to a minimum value or 0, a method of cutting the wafer 3 entirely by dicing applied as far as a part of the surface of the adhesive sheet 2 may be considered. However, this full cutting method is not practical because it has a drawback that the adhesive agent of the adhesive sheet 2 is stuck to the cutting edges of the dicer to decrease considerably the lifetime of the cutting edges. As an approach for decreasing the distance L2, a method of decreasing, to the minimum, the radius R of curvature of the hemispheric edge portion of the break pin 6 may be considered. However, in this method, if the wafer 3 is moved by the table 5 so as to be broken along the dicing lines, a so-called stick-slip phenomenon occurs between the break pin 6 and the adhesive sheet 2, causing damage to the back surface of the adhesive sheet 2. Therefore, this method cannot be used practically. It was made clear experimentally that a stick-slip phenomenon can be observed if the radius of curvature of the edge portion of the break pin 6 becomes about 1 mm or less.

In the following, let us consider a method of increasing the breaking force, particularly a bending moment of [Tz·L1] where Tz is a vertical component of the tension T and L1 is a distance between the acting point G of the vertical component Tz and the supporting point O. Increase of the vertical component Tz can be attained by increase of the raised amount of the break pin 6. However, if the raised amount is increased, the back surface of the adhesive sheet 2 might be damaged or transformed. It was made clear experimentally that it is necessary to limit the raised amount to less than about 5 mm.

The distance L1 varies dependent on the pattern of a device formed on the wafer 3 and the chip size. Particularly, in the case of a small chip of 3 mm$^2$ or less, the bending moment obtained is extremely small and breaking errors often occur when the wafer is divided by using the break pin 6.

In addition, because of the hemispheric shape of the edge portion of the break pin 6, there are involved serious disadvantages that if the wafer 3 is moved by the table 5 along the dicing lines, cracking occurs in portions other than the dicing lines or complicated cleavage faces are formed along the breaking lines because the breaking force is also applied in the directions other than the moving directions, and that a large amount of dust of the wafer (silicon dust) is produced and scattered on the upper surface of the device region to cause damage to the device.

Techniques of dividing a semiconductor wafer are disclosed for example in Japanese Patent Laying-Open Gazette Nos. 90478/1973 and 73871/1976. However, any of them cannot solve the above described problems.

SUMMARY OF THE INVENTION

A primary object of this invention is to provide a semiconductor wafer breaking apparatus which can break a semiconductor wafer precisely without error along dicing lines pursued by a table without any unfavorable influence of the breaking force changing according to the chip size and by which simple and plane cleavage faces can be obtained along the breaking lines and the amount of wafer dust can be reduced to the minimum.

Briefly stated, this invention is a semiconductor wafer breaking apparatus comprising breaking means having a shape of a circular arc or a disk, the edge portion thereof being triangular in section taken along a line passing through the center of the arc or the disk.

According to this invention, since the edge portion of the breaking means is triangular in section, breaking force is concentrated on the portion left uncut when the breaking means pushes the adhesive sheet upward. In addition, since the breaking means has the shape of a circular arc or a disk, breaking force is applied only to the portion corresponding to each dicing line pursued by the table in the same direction as the rotating direction of the circular arc or the disk. Further, since a stick-slip phenomenon does not occur, only the portion corresponding to each dicing line pursued by the table can be broken with precision independent of a change of the breaking force brought about according to the chip size. Consequently, simple and plane cleavage faces can be obtained along the breaking lines and there is little amount of water dust.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a perspective view showing a breaking member in a conductor wafer breaking apparatus of an embodiment of this invention.

FIG. 9 is a perspective view of a breaking member in a further preferred embodiment of this invention.

FIG. 10 is a front view of the breaking member in FIG. 9.

FIG. 11 is a side view of the breaking member in FIG. 9.

DESCRIPTION OF THE PREFERRED EMBODIMENTS

FIG. 8 is a perspective view showing a breaking member in a semiconductor wafer breaking apparatus of an embodiment of this invention and FIG. 9 is a perspective view showing a breaking member partially in section in a further preferred embodiment of this invention. FIG. 10 is a front view of the breaking member shown in FIG. 9 and FIG. 11 is a side view thereof.

The breaking member 9 shown in FIG. 8 is in the shape of a circular arc or segment having an edge which is triangular in cross-section and preferably having sides forming an isosceles triangle. The breaking member 9 shown in FIGS. 9 to 11 has a shape of a disk and this member 9 is supported rotatably around the center of the disk as an axis.

Figure 1:
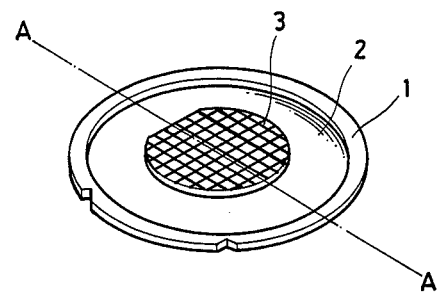
FIG. 1 is a perspective view showing a state in which a wafer is set on an adhesive sheet in a conventional semiconductor wafer breaking apparatus.
Figure 2:
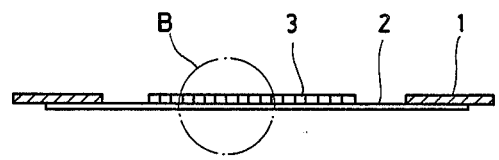
FIG. 2 is a sectional view taken along the line A—A in FIG. 1.
Figure 3:
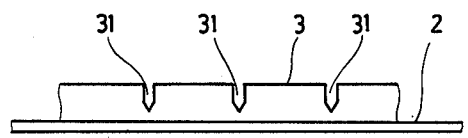
FIG. 3 is an enlarged view of the region B shown in FIG. 2.
Figure 4:
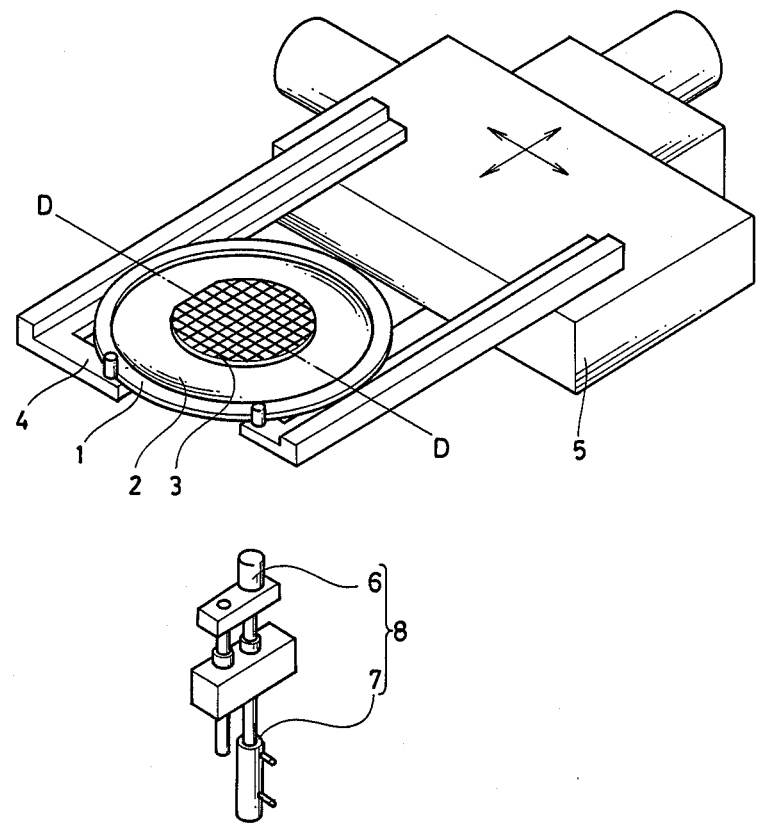
FIG. 4 is a perspective view of an appearance of a conventional semiconductor wafer breaking apparatus.
Figure 5:
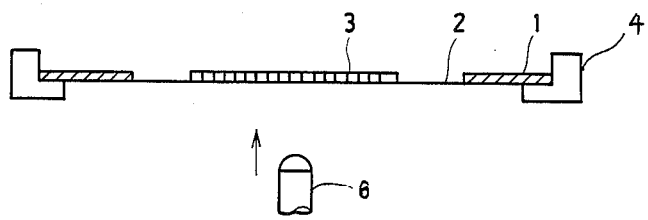
FIG. 5 is a view for explaining a state before a wafer is broken in a conventional semiconductor wafer breaking apparatus.
Figure 6:
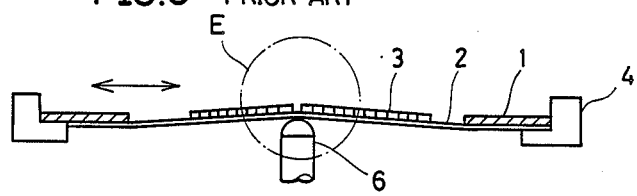
FIG. 6 is a view for explaining a state in which a wafer is being broken in a conventional semiconductor wafer breaking apparatus.
Figure 7:
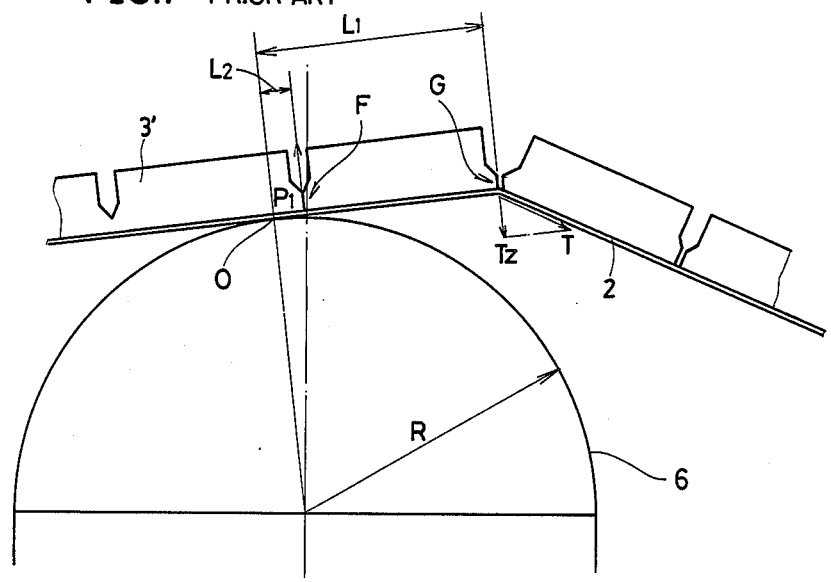
FIG. 7 is an enlarged view of the portion E shown in FIG. 6.
Figure 12:
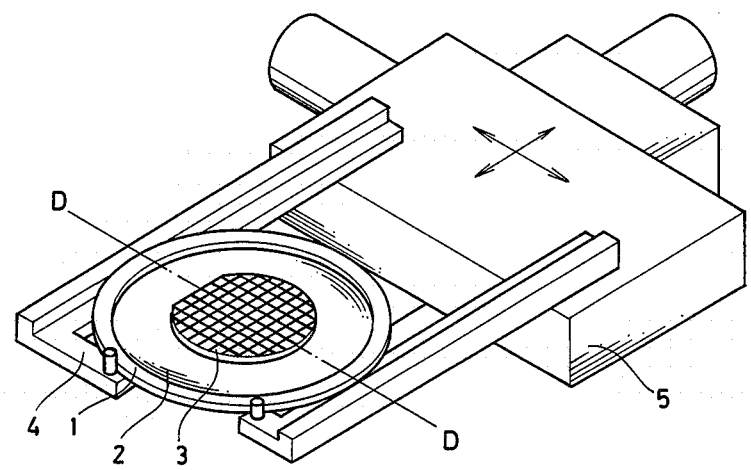
FIG. 12 is a view showing a semiconductor wafer breaking apparatus of an embodiment of this invention.
Figure 12:
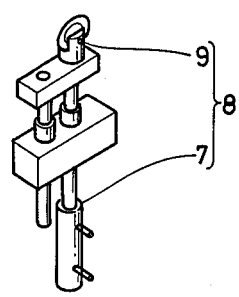
Figure 13:
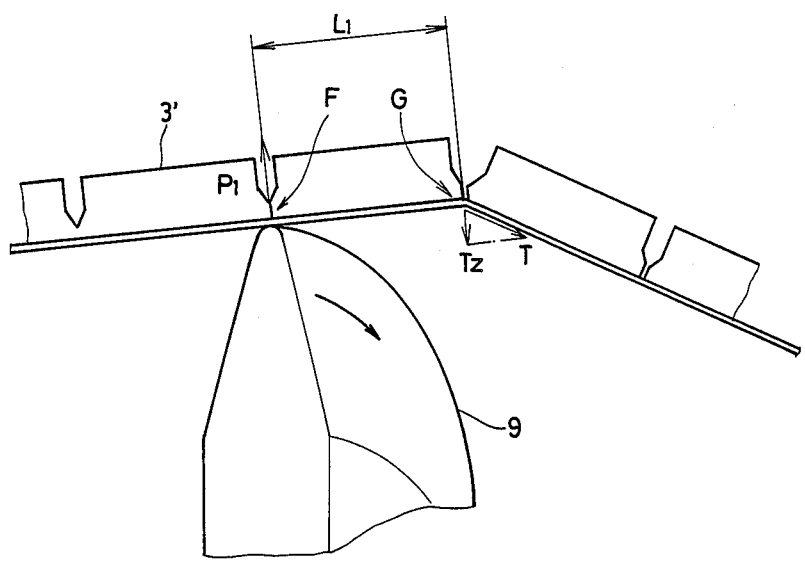
FIG. 13 is an illustration for explaining the function of a breaking member in accordance with this invention.

FIG. 12 is a perspective view showing a semiconductor wafer breaking apparatus of an embodiment of this invention and FIG. 13 is an illustration for explaining the function of a breaking member in accordance with this invention.

Referring to FIG. 12, the semi-full cut wafer 3 is put on the adhesive surface of an adhesive sheet uniformly attached to a frame 1. The wafer 3 is positioned together with the frame 1 by a table 5 provided with a frame positioning and fixing mechanism 4. Subsequently, the semi-full cut wafer 3 put on the adhesive sheet 2 is pushed upward by a prescribed amount by the breaking mechanism 8 positioned under the lower surface of the adhesive sheet 2, in the lower portion of the frame positioning and fixing mechanism 4. The breaking mechanism 8 comprises the breaking member 9 in accordance with this invention shown in FIGS. 9 to 11 and a vertical movement mechanism 7 for raising and lowering the breaking member 9. Although the breaking member 9 in FIG. 12 is represented as a disk, it is not limited thereto and it may have a shape of a circular arc. Then, the semi-full cut wafer 3 is moved in the same direction as the rotating direction of the disk or the circular arc of the breaking member 9 in a manner in which the breaking member 9 pursues, on the back surface of the adhesive sheet 2, the dicing lines read out in advance by identifying means (not shown).

In the above described sequential operation, tension T produced by pushing the adhesive sheet 2 upward by the breaking member 9 is generally applied to the end G of the portion 3' not divided out of the semi-full cut wafer 3 as shown in FIG. 13 and stress is applied to the portion 3'.

Since the breaking member 9 of this invention has the shape of a disk or a circular arc whose edge portion is triangular in section taken along a plane passing through the axis of rotation of the disk or the circular arc, stress is concentrated on the portion F in contact with the edge portion of the breaking member 9 and accordingly the wafer can be easily broken.

In addition, because of the shape of the disk or the circular arc of the breaking member 9 of this invention, breaking force is applied only to the same direction as the rotating direction of the disk or the circular arc when the semi-full cut wafer 3 is moved by the table 5 in the same direction as the rotating direction of the disk or the circular arc of the breaking member 9 along the dicing lines. Consequently, the breaking force is not applied to the portions other than those corresponding to the dicing lines as is different from a conventional break pin. Thus, only the portions corresponding to the dicing lines pursued by the table 5 can be broken with precision regardless of the magnitude of the breaking force and no error occurs in the breaking operation. In addition, simple and plane cleavage forms can be obtained along the breaking lines and little wafer dust is generated.

In addition, the edge portion of the breaking member 9 is triangular in section and this member 9 has a shape of a circular arc and preferably a shape of a disk. More preferably, the breaking member 9 is supported rotatably around the center of the disk as an axis. As a result, a stick-slip phenomenon never occurs if the adhesive sheet 2 is moved in the same direction as the rotating direction of the arc or the disk of the breaking member 9 in the state in which the breaking member 9 pushes the adhesive sheet 2 upward by a prescribed amount.

Furthermore, as shown in FIGS. 8 to 11, the breaking member 9 has a circular shape and preferably the edge portion thereof is an isosceles triangle in section taken along a plane passing through the center of the circle. More preferably, the breaking member 9 has an edge defining a circle of 360° and therefore is in the shape of a disk and it is supported rotatably with the center of the disk being used as an axis of rotation. As the breaking member 9 is rotated very smoothly on the adhesive sheet 2, no damage will be caused to adhesive sheet 2.

Although the breaking member in the above described embodiment has a shape of a circular arc or a shape of a disk with the edge portion thereof being triangular or isosceles triangular in section taken along a line plane passing through the center of the circle, or it is rotatably supported, the breaking member may have a thin disk with the edge portion thereof being round in section taken along a plane passing through the center of the disk.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor wafer breaking apparatus comprising
an adhesive sheet having a surface on which a semiconductor wafer is mounted, said wafer having cuts of a prescribed depth along dicing lines on the surface of said semiconductor wafer not in contact with said adhesive sheet,
a ring frame to which said adhesive sheet is attached,
a table movable along two axes perpendicular to each other for positioning and supporting said ring frame, and
breaking means positioned under said ring frame for pushing upward said semiconductor wafer from the back surface of said adhesive sheet to apply breaking pressure only along the dicing lines thereby to break said semiconductor wafer,
at least a portion of an edge portion of said breaking means in contact with said adhesive sheet being in the shape of a circular arc and a cross section thereof taken along a plane passing through the center of the circular arc being triangular.

2. A semiconductor wafer breaking apparatus in accordance with claim 1, wherein
the cross section of the edge portion of said breaking means is an isosceles triangle.

3. A semiconductor wafer breaking apparatus in accordance with claim 1, wherein
said breaking means has a shape of a disk.

4. A semiconductor wafer breaking apparatus in accordance with claim 3, wherein
said breaking means is rotatably supported around the center of said disk at the axis of rotation.

* * * * *